(12) United States Patent
Lin et al.

(10) Patent No.: US 10,665,645 B2
(45) Date of Patent: May 26, 2020

(54) TOUCH DISPLAY PANEL

(71) Applicant: Innolux Corporation, Miao-Li County (TW)

(72) Inventors: Hsiao-Lang Lin, Miao-Li County (TW); Jui-Jen Yueh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 151 days.

(21) Appl. No.: 15/717,959

(22) Filed: Sep. 28, 2017

(65) Prior Publication Data

US 2018/0108710 A1    Apr. 19, 2018

(30) Foreign Application Priority Data

Oct. 14, 2016    (CN) .......................... 2016 1 0896301

(51) Int. Cl.
| | |
|---|---|
| *G06F 3/041* | (2006.01) |
| *H01L 27/32* | (2006.01) |
| *H01L 51/52* | (2006.01) |
| *G06F 3/044* | (2006.01) |
| *H01L 27/12* | (2006.01) |

(52) U.S. Cl.
CPC ............ *H01L 27/323* (2013.01); *G06F 3/044* (2013.01); *G06F 3/0412* (2013.01); *H01L 27/3262* (2013.01); *H01L 27/3265* (2013.01); *H01L 51/5225* (2013.01); *G06F 2203/04111* (2013.01); *H01L 27/1255* (2013.01)

(58) Field of Classification Search
CPC ....... G06F 3/0412; G06F 3/044; H01L 27/323
USPC .................................................. 345/173, 174
See application file for complete search history.

(56) References Cited

U.S. PATENT DOCUMENTS

| 8,780,074 B2 * | 7/2014 | Castillo | .................. G06F 3/044 345/174 |
| 2016/0103649 A1 * | 4/2016 | Yoshitani | ................. G09G 3/20 345/694 |
| 2016/0124557 A1 * | 5/2016 | Choi | ..................... G06F 3/0412 345/173 |

\* cited by examiner

*Primary Examiner* — Calvin C Ma
(74) *Attorney, Agent, or Firm* — JCIPRNET

(57) ABSTRACT

The disclosure relates to a touch display panel, including a first substrate, an organic light emitting diode (OLED) device layer, a spacer, a first touch electrode, a second touch electrode, and a second substrate opposite to the first substrate. The OLED device layer is disposed on the first substrate and has a light emitting area. The spacer is disposed on the OLED device layer and located outside the light emitting area. The first touch electrode and the second touch electrode are disposed on the OLED device layer. The first touch electrode has a first bridge part. The first bridge part of the first touch electrode is interlaced with the second touch electrode. In particular, at least a portion of the first bridge part is disposed on the spacer.

14 Claims, 9 Drawing Sheets

TOUCH DISPLAY PANEL

CROSS-REFERENCE TO RELATED APPLICATION

This application claims the priority benefit of China application serial no. 201610896301.6, filed on Oct. 14, 2016. The entirety of the above-mentioned patent application is hereby incorporated by reference herein and made a part of this specification.

TECHNICAL FIELD

The disclosure relates to a display panel, and particularly relates to a touch display panel.

BACKGROUND

Touch display panels may be divided into out-cell type touch display panels, on-cell type touch display panels, and in-cell type touch display panels. Among the three types, in-cell type touch display panels have a thinner thickness. Besides, a touch electrode of the in-cell type touch display panel is disposed in or on an encapsulation layer, so the touch electrode may not be damaged by scratching easily. Therefore, the in-cell type touch display panels have become a key aspect in the development of the industry.

An in-cell type touch display panel includes a first substrate, a second substrate, an organic light emitting diode (OLED) device layer, and a touch electrode. The OLED device layer and the touch electrode is disposed between the first substrate and the second substrate. The touch electrode includes a plurality of sensing parts and a bridge part electrically connected between the sensing parts. Generally speaking, to reduce a resistance of the touch electrode, the bridge part is usually formed of a material having a low resistance rate. However, a material having a low resistance rate usually shields light. The bridge part having a low resistance rate may block a light emitting area of the OLED device layer, thus affecting the brightness of the in-cell type touch display panel.

SUMMARY

The disclosure provides a touch display panel having preferable touch and display properties.

The touch display panel of the disclosure includes a first substrate, an organic light emitting diode device layer, a spacer (or protrusion), a first touch electrode, a second touch electrode, and a second substrate. The organic light emitting diode device layer is disposed on the first substrate and has a light emitting area. The spacer (or protrusion) is disposed on the organic light emitting diode device layer and located outside the light emitting area. The first touch electrode and the second touch electrode are disposed on the organic light emitting diode layer. The first touch electrode has a first bridge part. The first bridge part of the first touch electrode is crossed with the second touch electrode. In particular, at least a portion of the first bridge part is disposed on the spacer (or protrusion). The organic light emitting diode device layer, the spacer (or protrusion), the first touch electrode, and the second touch electrode are located between the first substrate and the second substrate.

According to an embodiment of the disclosure, the first touch electrode further includes a plurality of first sensing parts. The first bridge part is electrically connected between two adjacent first sensing parts. The second touch electrode includes a plurality of second sensing parts and a second bridge part. The second bridge part is electrically connected between two adjacent second sensing parts. The first bridge part is crossed with the second bridge part. The first bridge part is electrically insulated from the second bridge part.

According to an embodiment of the disclosure, the touch display panel further includes an insulating pattern. The first sensing parts, the second sensing parts, and the second bridge part are disposed on the organic light emitting diode device layer. The insulating pattern covers the second bridge part. The first bridge part crosses the insulating pattern to electrically connect the two adjacent first sensing parts.

According to an embodiment of the disclosure, the touch display panel further includes an insulating pattern. The first bridge part is disposed on the organic light emitting diode device layer. The insulating pattern covers a portion of the first bridge part. The two adjacent first sensing parts cover two ends of the first bridge part. The second bridge part of the second touch electrode is located on the insulating pattern.

According to an embodiment of the disclosure, the first touch electrode further includes a plurality of first sensing parts. The first bridge part is electrically connected between two adjacent first sensing parts. The second touch electrode includes a plurality of second sensing parts and a second bridge part. The second bridge part is electrically connected between two adjacent second sensing parts. The first bridge part is crossed with the second bridge part. The first bridge part is electrically insulated from the second bridge part. According to an embodiment of the disclosure, the touch display panel further includes an insulating pattern. The first sensing parts and the second sensing parts are disposed on the organic light emitting diode device layer. The second bridge part is located on the spacer (or protrusion). The insulating pattern covers the second bridge part. The first bridge part crosses the insulating pattern to electrically connect the two adjacent first sensing parts.

According to an embodiment of the disclosure, the touch display panel further includes an insulating pattern. The first bridge part is disposed on the organic light emitting diode device layer. The insulating pattern covers a portion of the first bridge part. The two adjacent first sensing parts cover two ends of the first bridge part. The second sensing parts are disposed on the organic light emitting diode device layer. The second bridge part crosses the insulating pattern to electrically connect the two adjacent second sensing parts.

According to an embodiment of the disclosure, an end of the first bridge part is in an arc shape.

According to an embodiment of the disclosure, the second touch electrode includes a second bridge part crossed with the first bridge part. An end of the second bridge part is in an arc shape.

According to an embodiment of the disclosure, the first touch electrode further includes a plurality of first sensing parts. The first bridge part is electrically connected between two adjacent first sensing parts. An edge of a portion of one of the first sensing parts is in an arc shape.

According to an embodiment of the disclosure, the second touch electrode includes a plurality of second sensing parts and a second bridge part. The second bridge part is electrically connected between two adjacent second sensing parts. The first bridge part is crossed with the second bridge part. The first bridge part is electrically insulated from the second bridge part. An edge of a portion of one of the second sensing parts is in an arc shape.

According to an embodiment of the disclosure, the second touch electrode includes a plurality of second sensing parts and a second bridge part. The second bridge part is electrically connected between two adjacent second sensing parts. The first bridge part is crossed with the second bridge part. The first bridge part is electrically insulated from the second bridge part. At least one of the first bridge part and the second bridge part includes an S-shape pattern, and the S-shape pattern is away from the light emitting area by a distance in an arrangement direction of the light emitting area.

According to an embodiment of the disclosure, the second touch electrode includes a plurality of second sensing parts and a second bridge part. The second bridge part is electrically connected between two adjacent second sensing parts. The first bridge part is crossed with the second bridge part. The first bridge part is electrically insulated from the second bridge part. The second bridge part includes a plurality of conductive patterns separated from each other.

According to an embodiment of the disclosure, the conductive patterns and the first bridge part have acute angles.

According to an embodiment of the disclosure, the second touch electrode includes a plurality of second sensing parts and a second bridge part. The second bridge part is electrically connected between two adjacent second sensing parts. The first bridge part is crossed with the second bridge part. The first bridge part is electrically insulated from the second bridge part. At least one of the first bridge part and the second bridge part is a zigzag line pattern, and the zigzag line pattern is away from the light emitting area by a distance in an arrangement direction of the light emitting area.

According to an embodiment of the disclosure, the touch display panel further includes an encapsulation layer. The encapsulation layer covers the organic light emitting diode device layer. The first touch electrode and the second touch electrode are disposed on the encapsulation layer.

According to an embodiment of the disclosure, the organic light emitting diode device layer includes at least one active device disposed on the first substrate, a first display electrode electrically connected with the at least one active device, an insulating layer covering the at least one active device, and an organic light emitting pattern. The organic light emitting pattern is filled into an opening of an insulating layer to be electrically connected with the first display electrode.

According to an embodiment of the disclosure, the touch display panel further includes a second display electrode. The second display electrode covers and is electrically connected to the organic light emitting pattern.

According to an embodiment of the disclosure, the spacer (or protrusion) is disposed on the insulating layer.

According to an embodiment of the disclosure, the second display electrode covers the spacer (or protrusion), so as to form an electrode protruding part on the spacer. The encapsulation layer covers the second display electrode, so as to form an encapsulation protruding part on the electrode protruding part. The first bridge part is disposed on a stack structure formed by stacking the spacer (or protrusion), the electrode protruding part and the encapsulation protruding part.

Based on the above, the first bridge part adopted in the touch display panel according to an embodiment of the disclosure is electrically connected with two adjacent first sensing parts. The first sensing parts and the first bridge part are serially connected to form the first touch electrode. The first bridge part has a low resistance rate. Therefore, the first touch electrode has a low resistance, so the touch performance of the touch display panel is able to be facilitated. More importantly, the first bridge part is disposed on the spacer (or protrusion) outside the light emitting area. Therefore, the first bridge part does not overly affect the brightness of the touch display panel, and the touch display panel may exhibit preferable touch and display properties.

In order to make the aforementioned features and advantages of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
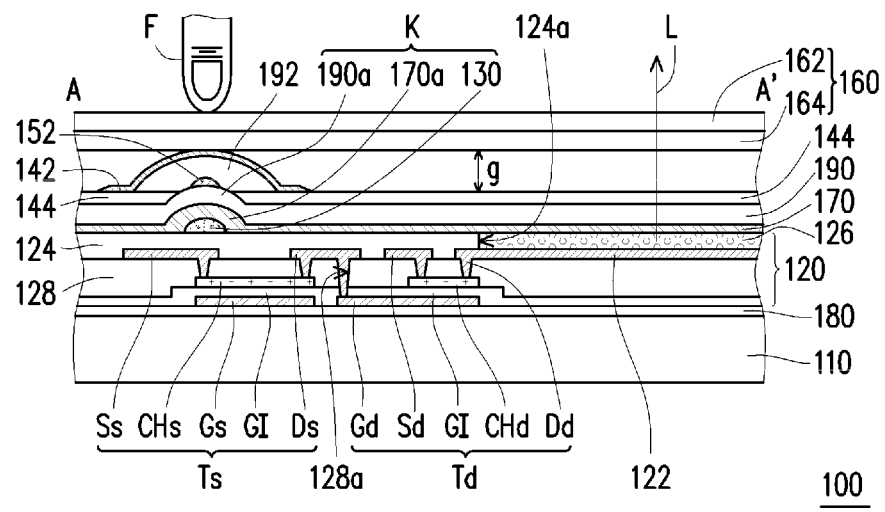
FIG. 1 is a schematic cross-sectional view illustrating a touch display panel according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
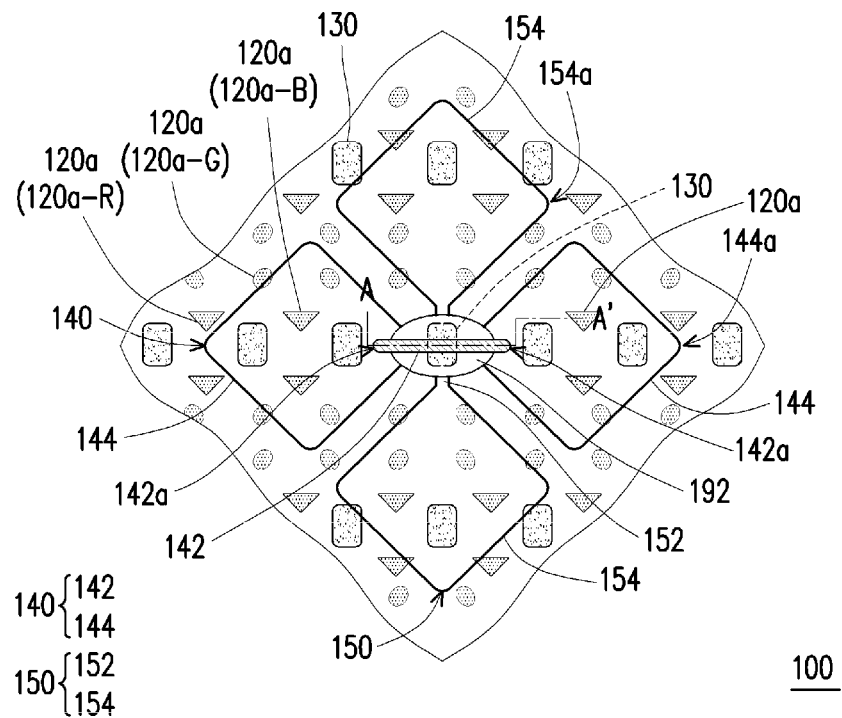
FIG. 2 is a schematic top view illustrating a touch display panel according to an embodiment of the disclosure.

FIG. 1 is a schematic cross-sectional view illustrating a touch display panel according to an embodiment of the disclosure. FIG. 2 is a schematic top view illustrating a touch display panel according to an embodiment of the disclosure. Specifically, FIG. 1 corresponds to a cross-sectional line A-A' of FIG. 2. Referring to FIGS. 1 and 2, a touch display panel 100 includes a first substrate 110, an organic light emitting diode (OLED) device layer 120, a spacer 130, a first touch electrode 140, a second touch electrode 150, and a second substrate 160. The spacer 130 may also be referred to as a protrusion. The second substrate 160 is disposed to be opposite to the first substrate 110. The OLED device layer 120, the spacer (or protrusion) 130, the first touch electrode 140, and the second touch electrode 150 are located between the first substrate 110 and the second substrate 160. In this embodiment, the spacer (or protrusion) 130 is able to maintain a cell gap g between the first substrate 110 and the second substrate 160. However, the disclosure is not limited thereto. In this embodiment, the second substrate 160 is a stack structure formed by a polarizer 162 and a barrier film 164, for example. The barrier film 164 is located between the polarizer 162 and the OLED device layer 120. The barrier film 162 may serve to buffer or to enable elastic recovery, so as to prevent a first bridge part 142 of the first touch electrode 140 or a second bridge part 152 of the second touch electrode 150 from being damaged when contacting the second substrate 160. The polarizer 162 allows a light beam L emitted by the OLED device layer 120 to exhibit a consistent polarization state, thereby enabling more comfortable viewing experience with the touch display panel 100. However, the disclosure is not limited thereto. In other embodiments, the second substrate 160 may also be other suitable structures, such as a transparent substrate formed of a single material, an anti-reflection multi-layer structure, a protection glass including a scratch-resistant material, a scratch-resistant coating, or the like. In this embodiment, a structure of the first substrate 110 may be a substrate formed of a single material. A material of the first substrate 110 may include, for example, glass, quartz, organic polymer, or an opaque/reflective material (e.g., a conductive material, wafer, ceramics, etc.). However, the disclosure is not limited thereto. In other embodiments, the material of the first substrate 110 may also include other suitable materials, and the structure of the first substrate 110 may also include other suitable materials, such as an anti-reflection multi-layer structure, a protection glass including a scratch-resistant material, a scratch-resistant coating, or the like. Besides, in other embodiments, the second substrate may be omitted. For example, if the touch display panel 100 is a flexible display or is applied in a flexible display, the polarizer 162 and/or the barrier film 164 may be directly disposed on the first substrate 110.

The OLED device layer 120 is disposed on the first substrate 110. The OLED device layer 120 includes an active device Td, an active device Ts, a first display electrode 122, an insulating layer 124, and an organic light emitting pattern 126. The active device Td and the active device Ts are disposed on the first substrate 110. The first display electrode 122 is electrically connected with the active device Td. The insulating layer 124 covers the active device Td and the active device Ts. The insulating layer 124 has an opening 124a. The opening 124a exposes the first display electrode 122. The organic light emitting pattern 126 is filled into the opening 124a of the insulating layer 124, so as to be electrically connected with the first display electrode 122. The touch display panel 100 further includes a transparent second display electrode 170. The second display electrode 170 covers and is electrically connected to the organic light emitting pattern 126. In this embodiment, the touch display panel 100 may optionally include a buffer layer 180. The buffer layer 180 covers the first substrate 110, and the OLED device layer 120 is disposed on the buffer layer 180. However, the disclosure is not limited thereto. In other embodiments, the buffer layer 180 may be omitted in the touch display panel 100, and the OLED device layer 120 may be directly disposed on the first substrate 110.

In this embodiment, the active device Ts is a selection transistor, for example, and the active device Td is a driving transistor, for example. The active device Ts has a gate Gs, a channel CHs, a gate insulating layer GI disposed between the gate Gs and the channel CHs and a source Ss and a drain Ds respectively electrically connected to two sides of the channel CHs. The active device Td has a gate Gd, a channel CHd, a gate insulating layer GI disposed between the gate Gd and the channel CHd and a source Sd and a drain Dd respectively electrically connected to two sides of the channel CHd. The drain Ds of the active device Ds is electrically connected with the gate Gd of the active device Td. More specifically, the drain Ds of the active device Ts may be disposed on an insulating layer 128 and filled into an opening 128a of the insulating layer 128, so as to come into electrical contact with the gate Gd of the active device Td. The source Sd of the active device Td has a system potential. The drain Dd of the active device Td is electrically connected with the first display electrode 122. The second display electrode 170 has a reference potential. The active device Ts is able to turn on the active device Td. When the active device Td is turned on, a potential difference is present between the second display electrode 170 and the first display electrode 122. Therefore, a driving current flows through the organic light emitting pattern 126, so that the organic light emitting pattern 126 emits the light beam L, thereby displaying a frame.

Referring to FIG. 2, the OLED device layer 120 has a light emitting area 120a. Referring to FIGS. 1 and 2, a position of the light emitting area 120a corresponds to a position of the organic light emitting pattern 126. As shown in FIG. 2, in this embodiment, the light emitting area 120a is able to emit the light beams L in various colors, so as to form a full-color frame. For example, the light emitting area 120a includes a light emitting area 120a-R, a light emitting area 120a-G, and a light emitting area 120-B. The light emitting area 120a-R is able to emit the light beam L in red. The light emitting area 120a-G is able to emit the light beam L in green. The light emitting area 120a-B is able to emit the light beam G in blue. The red, green, and blue light beams L may form a full-color frame and be mixed to form white light. However, the disclosure is not limited thereto. The colors and spectrum of the light beams L emitted by the light emitting area 120a may be determined based on practical needs. It should be noted that, a proportional relation between sizes of the light emitting areas 120a-R, 120a_G, and 120a_B and a size of the spacer (or protrusion) 130 shown in the drawings of the disclosure merely serves as an example, and the disclosure is not limited to such proportional relation. The proportional relation between the sizes of the light emitting areas 120a-R, 120a_G, and 120a_B and the size of the spacer (or protrusion) 130 may be determined based on practical needs.

Referring to FIGS. 1 and 2, the spacer (or protrusion) 130 is disposed on the OLED device layer 120 and located outside the light emitting area 120a. In other words, the spacer (or protrusion) 130 is not overlapped with the organic light emitting pattern 126. The spacer 130 may also be referred to as a protrusion. In this embodiment, the spacer (or protrusion) 130 may be disposed on the insulating layer 124. The second display electrode 170 may cover the spacer (or protrusion) 130, so as to form an electrode protruding part 170a on the spacer (or protrusion) 130. The touch display panel 100 further includes an encapsulation layer 190. The encapsulation layer 190 covers the OLED device layer 120 to prevent moisture or oxygen from entering the OLED device layer 120, thereby increasing reliability of the touch display panel 100. In this embodiment, the encapsulation layer 190 may cover the second display electrode 170 and form an encapsulation protruding part 190a on the electrode protruding part 170a. The spacer (or protrusion) 130, the electrode protruding part 170a, and the encapsulation protruding part 190a may be stacked to form a protruding structure K. As shown in FIG. 1, in this embodiment, the spacer (or protrusion) 130, the second display electrode 170, and the encapsulation layer 190 are sequentially stacked on the insulating layer 124. However, the disclosure is not limited thereto. In other embodiments, the spacer (or protrusion) 130, the second display electrode 170, and the encapsulation layer 190 may also be stacked in other suitable sequences. Besides, a shape of the spacer (or protrusion) 130 is not limited to the rectangular shape shown in the figure. In other embodiments, the spacer (or protrusion) 130 may also be designed to be in other arbitrary shapes.

Referring to FIGS. 1 and 2, the first touch electrode 140 and the second touch electrode 150 are disposed on the OLED device layer 120. The first touch electrode 140 has the first bridge part 142 and a plurality of first sensing parts 144. In addition, the first bridge part 142 is electrically connected between two adjacent first sensing parts 144. The second touch electrode 150 has the second bridge part 152 and a plurality of second sensing parts 154. In addition, the second bridge part 152 is electrically connected between two adjacent second sensing parts 154. The first bridge part 142 of the first touch electrode 140 is crossed with the second bridge part 152 of the second touch electrode 150, and the first bridge part 142 of the first touch electrode 140 is electrically insulated from the second bridge part 152 of the second touch electrode 150. The first sensing parts 144a and the second sensing parts 154 overlap with the light emitting area 120a. In this embodiment, the first touch electrode 140 may be a transmission electrode (Tx), and the second touch electrode 150 may be a reception electrode (Rx). However, the disclosure is not limited thereto. In other embodiments, the first touch electrode 140 may also be a reception electrode, and the second touch electrode 150 may also be a transmission electrode. In this embodiment, the first bridge part 142 may shield light, whereas the first sensing parts 144 and the second sensing parts 154 may be transparent. However, the disclosure is not limited thereto.

More specifically, in this embodiment, the first sensing parts 144, the second sensing parts 154, and the second bridge part 152 may be formed in the same transparent conductive layer. The first sensing parts 144, the second sensing parts 154, and the second bridge part 152 may be directly disposed on the encapsulation layer 190. At least a portion of the second bridge part 152 is located right above the spacer (or protrusion) 130 and overlaps with the spacer (or protrusion) 130. A material of the transparent conductive layer includes a metal oxide, such as indium-tin oxide, indium-zinc oxide, aluminum-tin oxide, aluminum-zinc oxide, indium-germanium-zinc oxide, other suitable oxides, or a stack layer of at least two thereof. However, it should be understood that the disclosure is not limited thereto. In this embodiment, the second bridge part 152 may be transparent. However, the disclosure is not limited thereto.

Referring to FIGS. 1 and 2, the touch display panel 100 further includes an insulating pattern 192. In this embodiment, the insulating pattern 192 may cover the second bridge part 152. The first bridge part 142 crosses the insulating pattern 192 to electrically connect two adjacent first sensing parts 144. It should be noted that at least a portion of the first bridge part 142 is disposed on the spacer (or protrusion) 130. At least a portion of the first bridge part 142 overlaps with the spacer (or protrusion) 130. The first bridge part 142 has a low resistance rate. In this embodiment, the first bridge part 142 may shield light. A material of the first bridge part 142 includes a metal, an alloy, or a stack layer thereof, for example. However, the disclosure is not limited thereto. By using the first bridge part 142 having a low resistance rate, an overall resistance of the first touch electrode 140 is able to be reduced, thereby facilitating the touch performance of the touch display panel 100. More importantly, the first bridge part 142 is disposed on the spacer (or protrusion) 130 outside the light emitting area 120a. Therefore, even if the first bridge part 142 having a low resistance rate may shield light, the first bridge part 142 does not overly affect the brightness of the touch display panel 100. Therefore, the touch display panel 100 may exhibit preferable touch and display properties. Another advantage of disposing the first bridge part 142 on the spacer (or protrusion) 130 is that a distance between the first bridge part 142 and a user F is reduced. Therefore, a touch sensitivity of the touch display panel 100 is able to be facilitated.

Referring to FIG. 2, in this embodiment, the first bridge part 142 may be formed as a straight line, so as to reduce a resistance of the first bridge part 142 itself, thereby reducing the overall resistance of the first touch electrode 140 and optimizing the touch performance of the touch display panel 100. An end 142a of the first bridge part 142 may be optionally in an arc shape. The arc-shaped end 142a is able to reduce a chance of point discharge, thereby facilitating the reliability of the touch display panel 100. In this embodiment, the first sensing part 144 and/or the second sensing part 154 may be substantially in a rhombus shape. An edge 144a of a portion of the first sensing part 144 and/or an edge 154a of a portion of the second sensing part 154 may be in an arc shape. Similarly, the arc-shaped edge 144a of the portion and/or the arc-shaped edge 154a of the portion are able to reduce the chance of point discharge, thereby facilitating the reliability of the touch display panel 100. However, the disclosure is not limited thereto. In other embodiments, the first bridge part 142, the first sensing part 144, and/or the second sensing part 154 may also be designed in other suitable shapes. Details will be described in the subsequent paragraphs with reference to other accompanying drawings.

Figure 3:
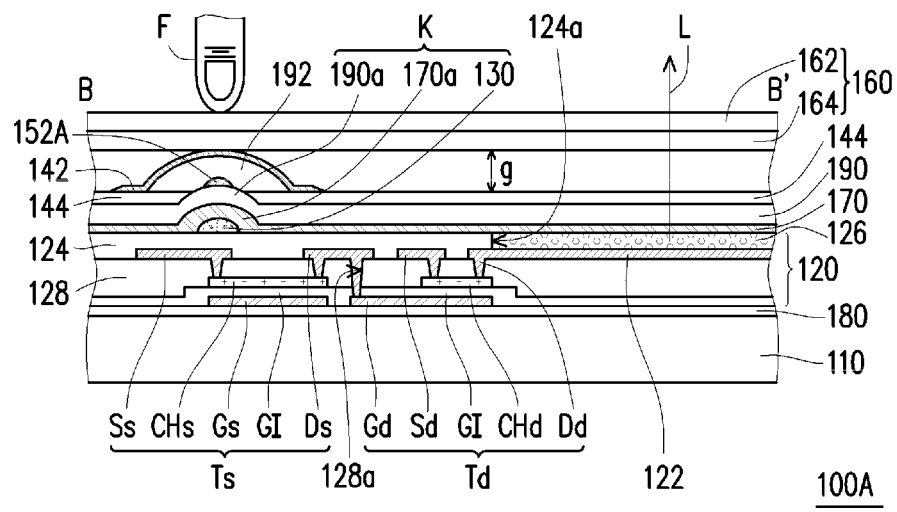
FIG. 3 is a schematic cross-sectional view illustrating a touch display panel according to another embodiment of the disclosure.
Figure 4:
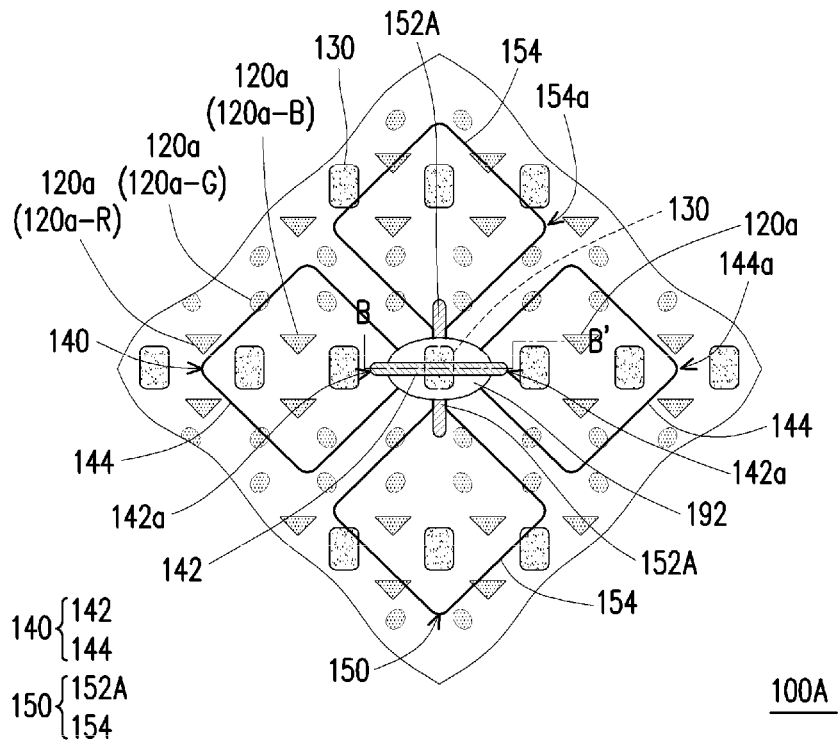
FIG. 4 is a schematic top view illustrating a touch display panel according to another embodiment of the disclosure.

FIG. 3 is a schematic cross-sectional view illustrating a touch display panel according to another embodiment of the disclosure. FIG. 4 is a schematic top view illustrating a touch display panel according to another embodiment of the disclosure. Specifically, FIG. 3 corresponds to a cross-sectional line B-B' of FIG. 4. Referring to FIGS. 3 and 4, a touch display panel 100A is similar to the touch display panel 100. Therefore, like or corresponding components are referred to with like or corresponding reference symbols. The touch display panel 100A mainly differs from the touch display panel 100 in that a second bridge part 152A of the touch display panel 100A is not transparent. The following descriptions mainly focus on the difference between the touch display panel 100A and the touch display panel 100, and the same or corresponding parts are referred to the foregoing descriptions.

Referring to FIGS. 3 and 4, the touch display panel 100A includes the first substrate 110, the OLED device layer 120, the spacer (or protrusion) 130, the first touch electrode 140, the second touch electrode 150, and the second substrate 160. The OLED device layer 120 is disposed on the first substrate 110 and has the light emitting area 120a. The spacer (or protrusion) 130 is disposed on the OLED device layer 120 and located outside the light emitting area 120a. The first touch electrode 140 and the second touch electrode 150 are disposed on the OLED device layer 120. The OLED device layer 120, the spacer (or protrusion) 130, the first touch electrode 140, and the second touch electrode 150 are located between the first substrate 110 and the second substrate 160. The first touch electrode 140 has the first bridge part 142 and the first sensing parts 144. In addition, the first bridge part 142 is electrically connected between two adjacent first sensing parts 144. The second touch electrode 150 has the second bridge part 152A and the second sensing parts 154. In addition, the second bridge part 152A is electrically connected between two adjacent second sensing parts 154. The first bridge part 142 of the first touch electrode 140 is crossed with the second bridge part 152A of the second touch electrode 150. In this embodiment, the first bridge part 142 may shield light, whereas the first sensing parts 144 and the second sensing parts 154 may be transparent. However, the disclosure is not limited thereto.

Referring to FIGS. 3 and 4, the first sensing part 144 and the second sensing part 154 may be formed in the same transparent conductive layer. The first sensing part 144 and the second sensing part 154 may be directly disposed on the encapsulation layer 190. Two ends 152a of the second bridge part 152A may respectively cover two adjacent second sensing parts 154, so as to electrically connect the two adjacent second sensing parts 154. The insulating pattern 192 covers the second bridge part 152A. The first bridge part 142 crosses the insulating pattern 192 to electrically connect two adjacent first sensing parts 144. In this embodiment, the second bridge part 152A may shield light. However, the disclosure is not limited thereto.

It should be noted that, in this embodiment, the first bridge part 142 and the second bridge part 152A have low resistance rates. Materials of the first bridge part 142 and the second bridge part 152A include a metal, an alloy, or a stack layer thereof, for example. However, the disclosure is not limited thereto. By using the first bridge part 142 and the second bridge part 152A having low resistance rates, the resistances of the first touch electrode 140 and the second touch electrode 150 are able to be reduced, thereby further facilitating the touch performance of the touch display panel 100A. More importantly, the first bridge part 142 and the second bridge part 152A are disposed on the spacer (or protrusion) 130 outside the light emitting area 120a. Therefore, even if the first bridge part 142 and the second bridge part 152A may shield light, the first bridge part 142 and the second bridge part 152A do not overly affect the brightness of the touch display panel 100A. Therefore, the touch display panel 100 may exhibit preferable touch and display properties.

Referring to FIG. 4, in this embodiment, the second bridge part 152A may be formed as a straight line, so as to reduce a resistance of the second bridge part 152A itself, thereby reducing the overall resistance of the second touch electrode 150 and optimizing the touch performance of the touch display panel 100A. An end 152a of the second bridge part 152A may be optionally in an arc shape. The arc-shaped end 152a is able to reduce a chance of point discharge, thereby facilitating the reliability of the touch display panel 100A. However, the disclosure is not limited thereto. In other embodiments, the second bridge part 152A may also be designed in other suitable shapes. Details will be described in the subsequent paragraphs with reference to other accompanying drawings.

Figure 5:
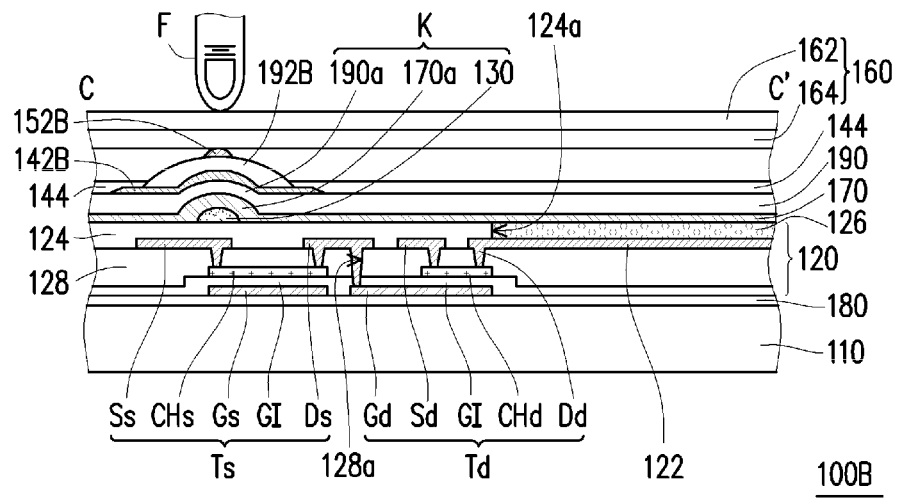
FIG. 5 is a schematic cross-sectional view illustrating a touch display panel according to still another embodiment of the disclosure.
Figure 6:
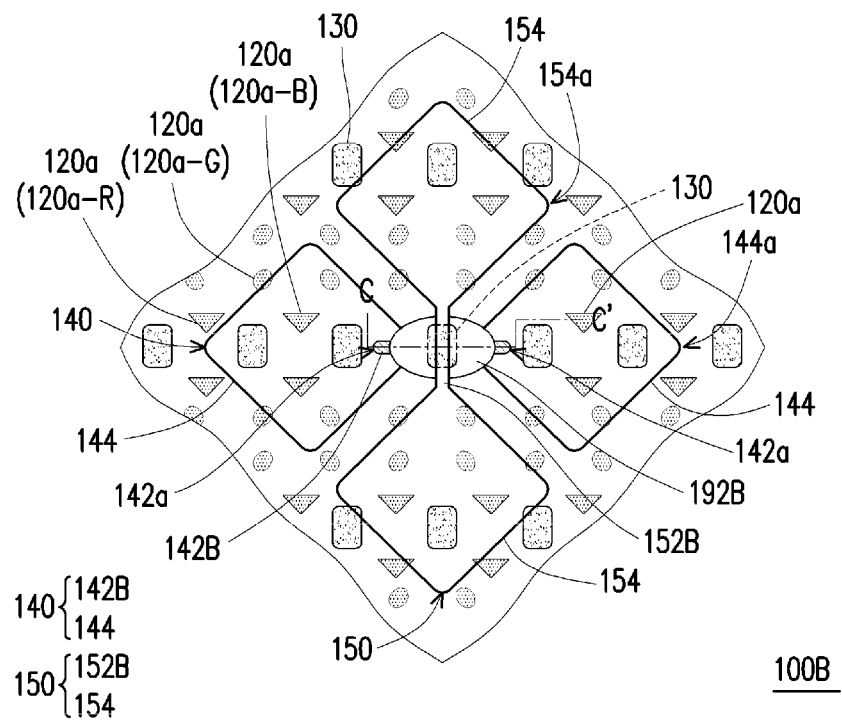
FIG. 6 is a schematic top view illustrating a touch display panel according to still another embodiment of the disclosure.

FIG. 5 is a schematic cross-sectional view illustrating a touch display panel according to still another embodiment of the disclosure. FIG. 6 is a schematic top view illustrating a touch display panel according to still another embodiment of the disclosure. Specifically, FIG. 5 corresponds to a cross-sectional line C-C' of FIG. 6. Referring to FIGS. 5 and 6, a touch display panel 100B is similar to the touch display panel 100. Therefore, like or corresponding components are referred to with like or corresponding reference symbols. The touch display panel 100B mainly differs from the touch display panel 100 in that a first bridge part 142B, an insulating pattern 192B, and a second bridge part 152B of the touch display panel 100B are stacked differently from the way that the first bridge part 142, the insulating pattern 192, and the second bridge part 152 of the touch display panel 100 are stacked. The following descriptions mainly focus on the difference between the touch display panel 100B and the touch display panel 100, and the same or corresponding parts are referred to the foregoing descriptions.

Referring to FIGS. 5 and 6, the touch display panel 100B includes the first substrate 110, the OLED device layer 120, the spacer (or protrusion) 130, the first touch electrode 140, the second touch electrode 150, and the second substrate 160. The OLED device layer 120 is disposed on the first substrate 110 and has the light emitting area 120a. The spacer (or protrusion) 130 is disposed on the OLED device layer 120 and located outside the light emitting area 120a. The first touch electrode 140 and the second touch electrode 150 are disposed on the OLED device layer 120. The OLED device layer 120, the spacer (or protrusion) 130, the first touch electrode 140, and the second touch electrode 150 are located between the first substrate 110 and the second substrate 160. The first touch electrode 140 has the first bridge part 142B and the first sensing parts 144. In addition, the first bridge part 142B is electrically connected between two adjacent first sensing parts 144. The second touch electrode 150 has the second bridge part 152B and the second sensing parts 154. In addition, the second bridge part 152B is electrically connected between two adjacent second sensing parts 154. The first bridge part 142B of the first touch electrode 140 is crossed with the second bridge part 152B of the second touch electrode 150. In this embodiment, the first bridge part 142B may shield light, whereas the first sensing part 144 and the second sensing part 154 may be transparent. However, the disclosure is not limited thereto.

What differs from the touch display panel 100 is that, in this embodiment, the first bridge part 142B may be directly disposed on the encapsulation layer 190. The insulating pattern 192B covers a portion of the first bridge part 142B and exposes the two ends 142a of the first bridge part 142B. The first sensing parts 144, the second sensing parts 154, and the second bridge part 152B are formed in the same transparent conductive layer. Two adjacent first sensing parts 144 respectively cover the two ends 142a of the first bridge part 142B. The second sensing part 154 may be directly disposed on the encapsulation layer 190. The second bridge part 152B is located on the insulating pattern 192B. The touch display panel 100B and the touch display panel 100 have similar effects and advantages. Therefore, details in this regard will not be repeated in the following.

Figure 7:
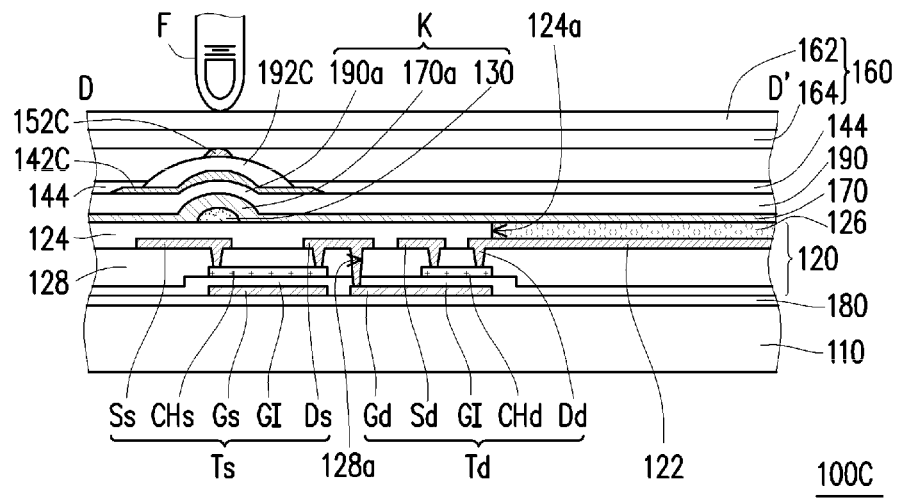
FIG. 7 is a schematic cross-sectional view illustrating a touch display panel according to yet another embodiment of the disclosure.
Figure 8:
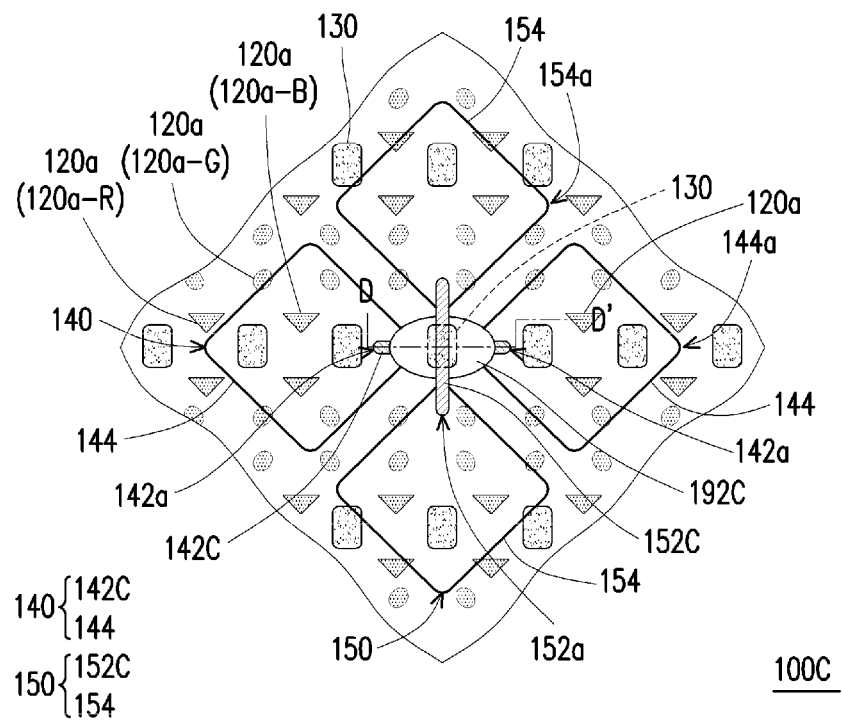
FIG. 8 is a schematic top view illustrating a touch display panel according to yet another embodiment of the disclosure.

FIG. 7 is a schematic cross-sectional view illustrating a touch display panel according to yet another embodiment of the disclosure. FIG. 8 is a schematic top view illustrating a touch display panel according to yet another embodiment of the disclosure. Specifically, FIG. 7 corresponds to a cross-sectional line D-D' of FIG. 8. Referring to FIGS. 7 and 8, a touch display panel 100C is similar to the touch display panel 100A. Therefore, like or corresponding components are referred to with like or corresponding reference symbols. The touch display panel 100C mainly differs from the touch display panel 100A in that a first bridge part 142C, a second bridge part 152C, and an insulating pattern 192C of the touch display panel 100C are stacked differently from the way that the first bridge part 142, the second bridge part 152A, and the insulating pattern 192 of the touch display panel 100A are stacked. The following descriptions mainly focus on the difference between the touch display panel 100C and the touch display panel 100, and the same or corresponding parts are referred to the foregoing descriptions.

Referring to FIGS. 7 and 8, the touch display panel 100C includes the first substrate 110, the OLED device layer 120, the spacer (or protrusion) 130, the first touch electrode 140, the second touch electrode 150, and the second substrate 160. The OLED device layer 120 is disposed on the first substrate 110 and has the light emitting area 120a. The spacer (or protrusion) 130 is disposed on the OLED device layer 120 and located outside the light emitting area 120a. The first touch electrode 140 and the second touch electrode 150 are disposed on the OLED device layer 120. The OLED device layer 120, the spacer (or protrusion) 130, the first touch electrode 140, and the second touch electrode 150 are located between the first substrate 110 and the second substrate 160. The first touch electrode 140 has the first bridge part 142C and the first sensing parts 144. In addition, the first bridge part 142C is electrically connected between two adjacent first sensing parts 144. The second touch electrode 150 has the second bridge part 152C and the second sensing parts 154. In addition, the second bridge part 152C is electrically connected between two adjacent second sensing parts 154. The first bridge part 142C of the first touch electrode 140 is crossed with the second bridge part 152C of the second touch electrode 150. In this embodiment, the first bridge part 142C may shield light, whereas the first sensing part 144 and the second sensing part 154 may be transparent. However, the disclosure is not limited thereto.

What differs from the touch display panel 100A is that, in this embodiment, the first bridge part 142C is directly disposed on the encapsulation layer 190. An insulating pattern 192C covers a portion of the first bridge part 142C and exposes the two ends 142a of the first bridge part 142C. The first sensing parts 144 and the second sensing parts 154 are formed in the same transparent conductive layer. The first sensing part 144 and the second sensing part 154 are disposed on the encapsulation layer 190. Two adjacent first sensing parts 144 respectively cover the two ends 142a of the first bridge part 142C. The second bridge part 152 crosses the insulating pattern 192C to electrically connect two adjacent second sensing parts 154. In this embodiment, the second bridge part 152C may be transparent. However, the disclosure is not limited thereto. The touch display panel 100C and the touch display panel 100A have similar effects and advantages. Therefore, details in this regard will not be repeated in the following.

Figure 9:
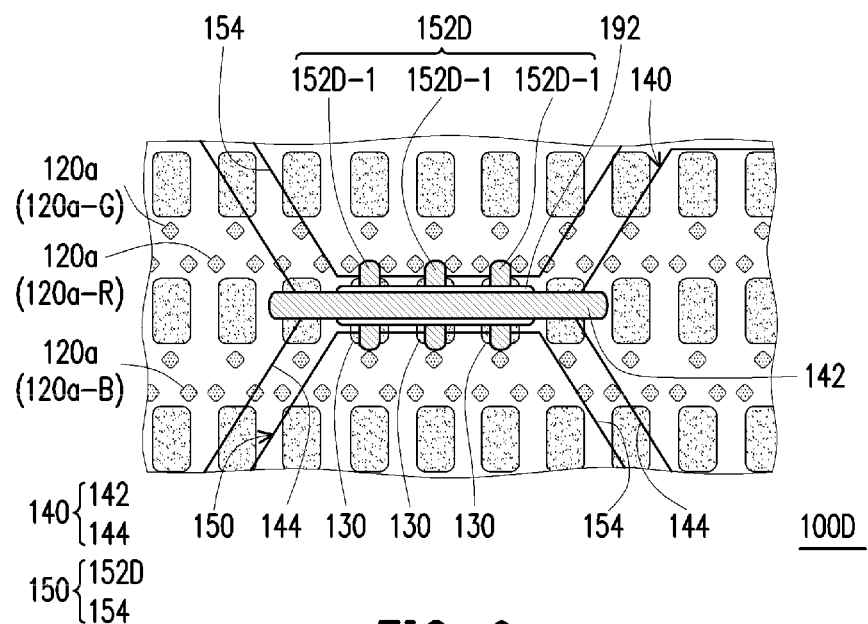
FIG. 9 is a schematic top view illustrating a touch display panel according to an embodiment of the disclosure.

FIG. 9 is a schematic top view illustrating a touch display panel according to an embodiment of the disclosure. A touch display panel 100D of FIG. 9 is similar to the touch display panel 100A. Therefore, like or corresponding components are referred to with like or corresponding reference symbols. The touch display panel 100D mainly differs from the touch display panel 100A in that at least one of the first bridge part 142 and a second bridge part 152D shields light, and the at least one light shielding component may be designed to be a plurality of conductive patterns separated from each other. The following descriptions mainly focus on the difference between the touch display panel 100D and the touch display panel 100A, and the same or corresponding parts are referred to the foregoing descriptions.

Referring to FIG. 9, the touch display panel 100D includes the first touch electrode 140 and the second touch electrode 150. The first touch electrode 140 has the first bridge part 142 and the first sensing parts 144. In addition, the first bridge part 142 is electrically connected between two adjacent first sensing parts 144. The second touch electrode 150 has the second bridge part 152D and the second sensing parts 154. In addition, the second bridge part 152D is electrically connected between two adjacent second sensing parts 154. The first bridge part 142 of the first touch electrode 140 is crossed with the second bridge part 152D of the second touch electrode 150. What differs from the touch display panel 100A is that, in the embodiment of FIG. 9, at least one (e.g., the second bridge part 152D) of the first bridge part 142 and the second bridge part 152D may be designed as a plurality of conductive patterns 152D-1 separated from each other, so as to reduce the resistance of at least one (e.g., the second bridge part 152D) of the first bridge part 142 and the second bridge part 152D. More specifically, the conductive patterns 152D-1 of the second bridge part 152D may be perpendicular to the first bridge part 142. However, the disclosure is not limited thereto. The touch display panel 100D and the touch display panel 100A have similar effects and advantages. Therefore, details in this regard will not be repeated in the following.

Figure 10:
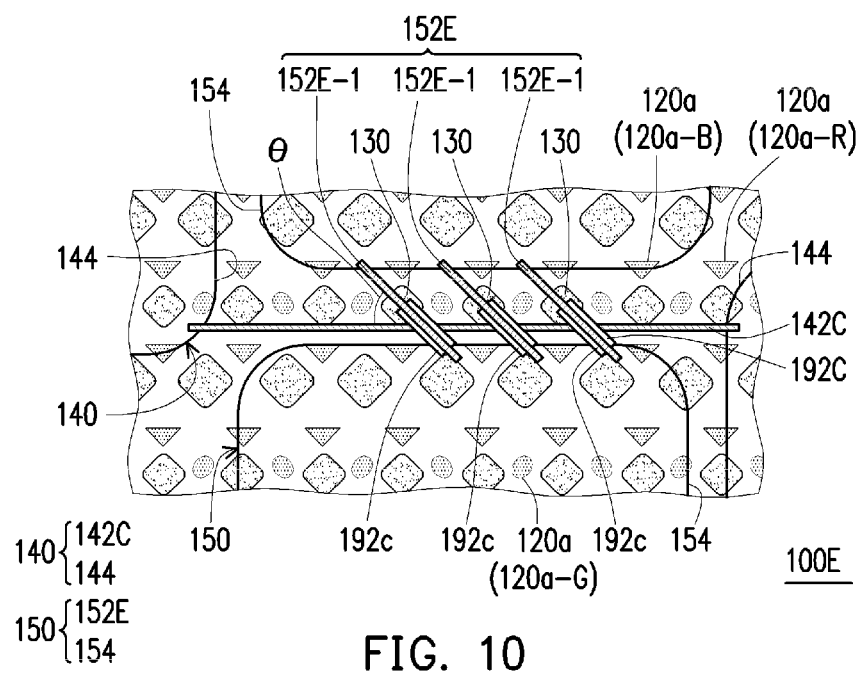
FIG. 10 is a schematic top view illustrating a touch display panel according to another embodiment of the disclosure.

FIG. 10 is a schematic top view illustrating a touch display panel according to another embodiment of the disclosure. A touch display panel 100E of FIG. 10 is similar to the touch display panel 100C. Therefore, like or corresponding components are referred to with like or corresponding reference symbols. The touch display panel 100E mainly differs from the touch display panel 100C in that at least one of the first bridge part 142C and a second bridge part 152E shields light, and the at least one light shielding component may be designed to be a plurality of conductive patterns separated from each other. The following descriptions mainly focus on the difference between the touch display panel 100E and the touch display panel 100C, and the same or corresponding parts are referred to the foregoing descriptions.

Referring to FIG. 10, the touch display panel 100E includes the first touch electrode 140 and the second touch electrode 150. The first touch electrode 140 has the first bridge part 142C and the first sensing parts 144. In addition, the first bridge part 142 is electrically connected between two adjacent first sensing parts 144. The second touch electrode 150 has the second bridge part 152E and the second sensing parts 154. In addition, the second bridge part 152E is electrically connected between two adjacent second sensing parts 154. The first bridge part 142C of the first touch electrode 140 is crossed with the second bridge part 152E of the second touch electrode 150. What differs from the touch display panel 100C is that, in the embodiment of FIG. 10, at least one (e.g., the second bridge part 152E) of the first bridge part 142C and the second bridge part 152E may be designed as a plurality of conductive patterns 152E-1 separated from each other, so as to reduce the resistance of at least one (e.g., the second bridge part 152E) of the first bridge part 142 and the second bridge part 152E. More specifically, the conductive pattern 152E1 of the second bridge part 152E and the first bridge part 142C have acute angles θ. The touch display panel 100E and the touch display panel 100C have similar effects and advantages. Therefore, details in this regard will not be repeated in the following.

Figure 11:
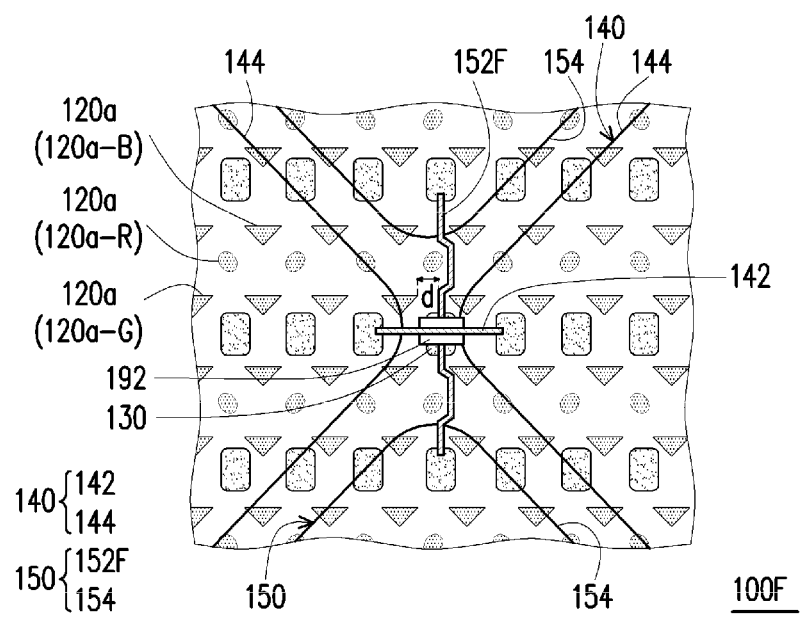
FIG. 11 is a schematic top view illustrating a touch display panel according to still another embodiment of the disclosure.

FIG. 11 is a schematic top view illustrating a touch display panel according to still another embodiment of the disclosure. A touch display panel 100F of FIG. 11 is similar to the touch display panel 100A. Therefore, like or corresponding components are referred to with like or corresponding reference symbols. The touch display panel 100F mainly differs from the touch display panel 100A in that at least one of the first bridge part 142 and a second bridge part 152F shields light, and the at least one light shielding component (e.g., the second bridge part 152F) may include an S-shaped pattern. The following descriptions mainly focus on the difference between the touch display panel 100F and the touch display panel 100A, and the same or corresponding parts are referred to the foregoing descriptions.

Figure 12:
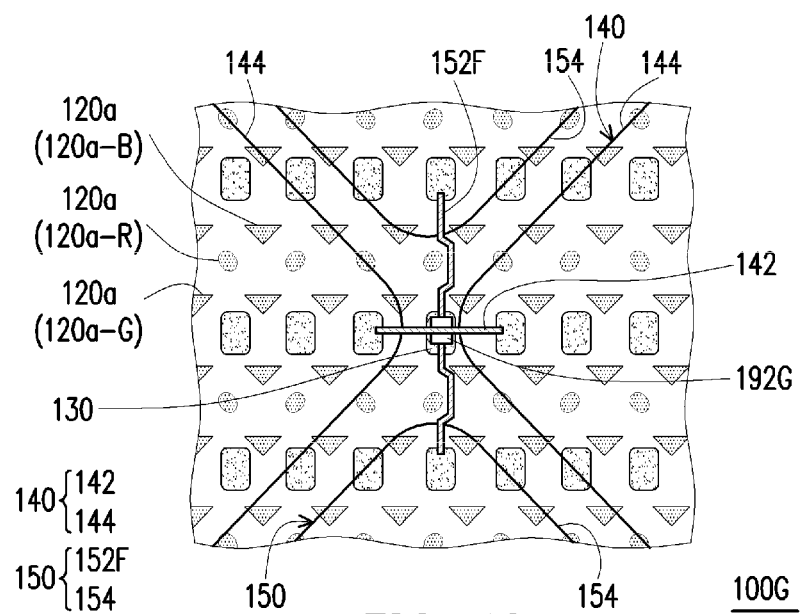
FIG. 12 is a schematic top view illustrating a touch display panel according to yet another embodiment of the disclosure.

Referring to FIG. 11, the touch display panel 100F includes the first touch electrode 140 and the second touch electrode 150. The first touch electrode 140 has the first bridge part 142 and the first sensing parts 144. In addition, the first bridge part 142 is electrically connected between two adjacent first sensing parts 144. The second touch electrode 150 has a second bridge part 152F and the second sensing parts 154. In addition, the second bridge part 152F is electrically connected between two adjacent second sensing parts 154. The first bridge part 142 of the first touch electrode 140 is crossed with the second bridge part 152F of the second touch electrode 150. What differs from the touch display panel 100A is that, in the embodiment of FIG. 11, at least one of the first bridge part 142 and the second bridge part 152F (e.g., the second bridge part 152F) may be designed to be a bent pattern, so as to bypass the light emitting area 120a. The bent pattern may include a pattern substantially similar to an S-shaped pattern. The S-shaped pattern (i.e., the second bridge part 152F) is away from the light emitting area 120a by a distance d in an arrangement direction of the light emitting area. Besides, the insulating pattern 192 of the touch display panel 100F may exceed the corresponding spacer (or protrusion) 130. However, the disclosure is not limited thereto. FIG. 12 is a schematic top view illustrating a touch display panel according to yet another embodiment of the disclosure. In the embodiment of FIG. 12, an insulating pattern 192G of a touch display panel 100G may not exceed the corresponding spacer (or protrusion) 130. In other words, from a top perspective, viewing toward a direction perpendicular to the first substrate 110, an orthogonal projection of the insulating pattern 192G on the first substrate 110 may fall within an orthogonal projection of the corresponding spacer (or protrusion) 130 on the first substrate 110. The touch display panels 100F and 100G and the touch display panel 100A have similar effects and advantages. Therefore, details in this regard will not be repeated in the following.

Figure 13:
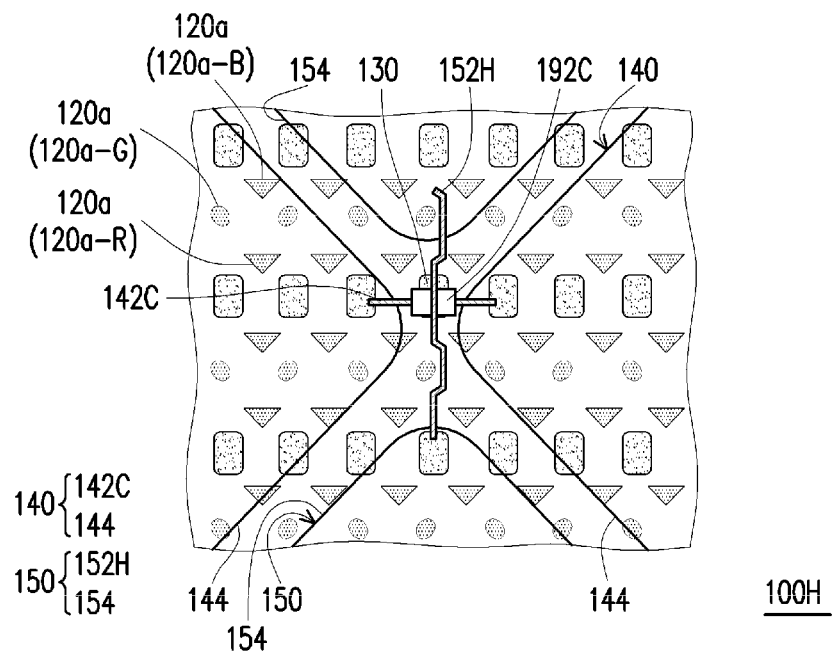
FIG. 13 is a schematic top view illustrating a touch display panel according to an embodiment of the disclosure.

FIG. 13 is a schematic top view illustrating a touch display panel according to an embodiment of the disclosure. A touch display panel 100H of FIG. 13 is similar to the touch display panel 100C. Therefore, like or corresponding components are referred to with like or corresponding reference symbols. The touch display panel 100H mainly differs from the touch display panel 100C in that at least one of the first bridge part 142C and a second bridge part 152H shields light, and the at least one light shielding component (e.g., the second bridge part 152H) may include an S-shaped pattern. The following descriptions mainly focus on the difference between the touch display panel 100H and the touch display panel 100C, and the same or corresponding parts are referred to the foregoing descriptions.

Figure 14:
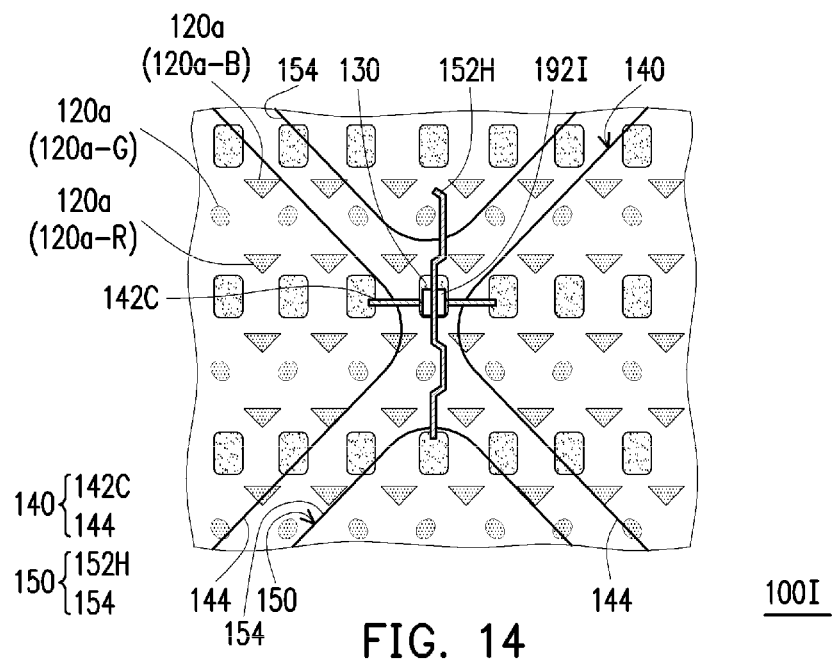
FIG. 14 is a schematic top view illustrating a touch display panel according to another embodiment of the disclosure.

Referring to FIG. 13, the touch display panel 100H includes the first touch electrode 140 and the second touch electrode 150. The first touch electrode 140 has the first bridge part 142C and the first sensing parts 144. In addition, the first bridge part 142C is electrically connected between two adjacent first sensing parts 144. The second touch electrode 150 has the second bridge part 152H and the second sensing parts 154. In addition, the second bridge part 152H is electrically connected between two adjacent second sensing parts 154. The first bridge part 142C of the first touch electrode 140 is crossed with the second bridge part 152H of the second touch electrode 150. What differs from the touch display panel 100C is that, in the embodiment of FIG. 13, at least one of the first bridge part 142C and the second bridge part 152H (e.g., the second bridge part 152H) may be designed to be a bent pattern, so as to bypass the light emitting area 120a. The bent pattern may include a pattern substantially similar to an S-shaped pattern. Besides, the insulating pattern 192 of the touch display panel 100H may exceed the corresponding spacer (or protrusion) 130. However, the disclosure is not limited thereto. FIG. 14 is a schematic top view illustrating a touch display panel according to another embodiment of the disclosure. In the embodiment of FIG. 14, an insulating pattern 192I of a touch display panel 100I may not exceed the corresponding spacer (or protrusion) 130. The touch display panels 100F and 100G and the touch display panel 100A have similar effects and advantages. Therefore, details in this regard will not be repeated in the following.

Figure 15:
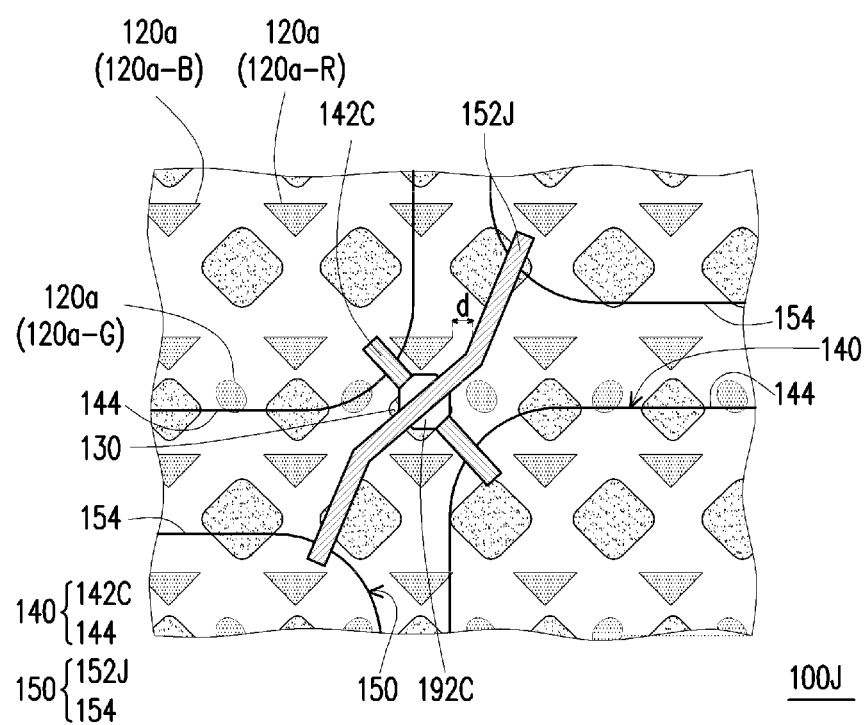
FIG. 15 is a schematic top view illustrating a touch display panel according to still another embodiment of the disclosure.

FIG. 15 is a schematic top view illustrating a touch display panel according to still another embodiment of the disclosure. A touch display panel 100J of FIG. 15 is similar to the touch display panel 100C. Therefore, like or corresponding components are referred to with like or corresponding reference symbols. The touch display panel 100J mainly differs from the touch display panel 100C in that at least one of the first bridge part 142C and a second bridge part 152J shields light, and the at least one light shielding component (e.g., the second bridge part 152J) may designed to be a zigzag line pattern. The following descriptions mainly focus on the difference between the touch display panel 100J and the touch display panel 100C, and the same or corresponding parts are referred to the foregoing descriptions.

Referring to FIG. 15, the touch display panel 100J includes the first touch electrode 140 and the second touch electrode 150. The first touch electrode 140 has the first bridge part 142C and the first sensing parts 144. The first bridge part 142C is electrically connected between two adjacent first sensing parts 144. The second touch electrode 150 has a second bridge part 152J and the second sensing parts 154. The second bridge part 152J is electrically connected between two adjacent second sensing parts 154. The first bridge part 142C of the first touch electrode 140 is crossed with the second bridge part 152J of the second touch electrode 150. What differs from the touch display panel 100C is that, in the embodiment of FIG. 15, at least one of the first bridge part 142C and the second bridge part 152J (e.g., the second bridge part 152J) may be designed to be a zigzag line pattern, and the zigzag line pattern is away from the light emitting area 120a by the distance d in the arrangement direction of the light emitting area. The touch display panel 100J and the touch display panel 100C have similar effects and advantages. Therefore, details in this regard will not be repeated in the following.

Figure 16:
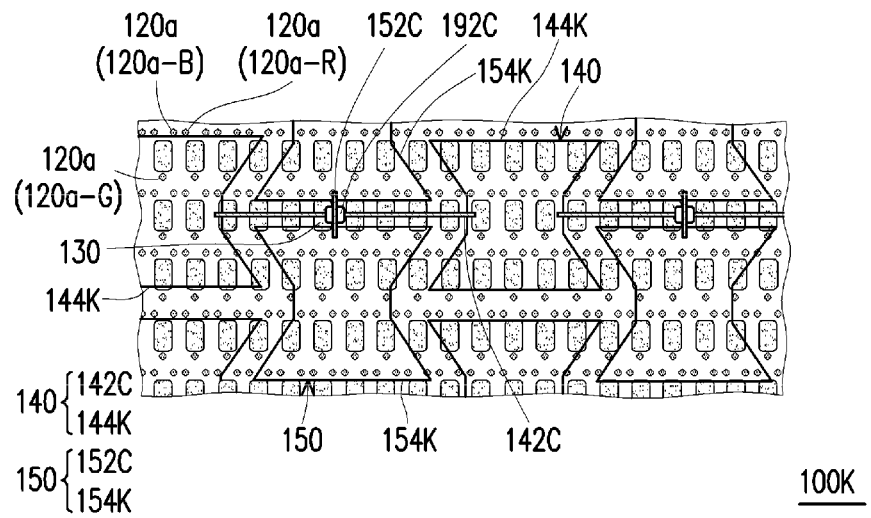
FIG. 16 is a schematic top view illustrating a touch display panel according to yet another embodiment of the disclosure.

FIG. 16 is a schematic top view illustrating a touch display panel according to yet another embodiment of the disclosure. A touch display panel 100K of FIG. 16 is similar to the touch display panel 100C. Therefore, like or corresponding components are referred to with like or corresponding reference symbols. The touch display panel 100K mainly differs from the touch display panel 100C in that shapes of the first sensing parts 144 and the second sensing parts 154 of the touch display panel 100C differ from shapes of first sensing parts 144K and second sensing parts 154K of the touch display panel 100K. The following descriptions mainly focus on the difference between the touch display panel 100K and the touch display panel 100C, and the same or corresponding parts are referred to the foregoing descriptions.

Referring to FIG. 16, the touch display panel 100K includes the first touch electrode 140 and the second touch electrode 150. The first touch electrode 140 has the first bridge part 142C and the first sensing parts 144K. The first bridge part 142C is electrically connected between two adjacent first sensing parts 144K. The second touch electrode 150 has the second bridge part 152J and the second sensing parts 154K. The second bridge part 152C is electrically connected between two adjacent second sensing parts 154K. The first bridge part 142C of the first touch electrode 140 is crossed with the second bridge part 152C of the second touch electrode 150. What differs from the touch display panel 100C is that, in the embodiment of FIG. 16, the first sensing parts 144K and the second sensing parts 154K may be optionally designed to be in a funnel shape, unlike the first sensing parts 144 and the second sensing parts 154 that are designed to be in a rhombus shape. It should be noted that, whether the first sensing parts and the second sensing parts are in the funnel shape or the rhombus shape, such shapes merely serve as examples in the descriptions of the disclosure, instead of limitations to the disclosure. The shape of the first sensing parts and the shape of the second sensing parts may be properly designed differently based on practical needs. In this embodiment, the first bridge part 142C may shield light, whereas the first sensing part 144K and the second sensing part 154K may be transparent. However, the disclosure is not limited thereto.

Figure 17:
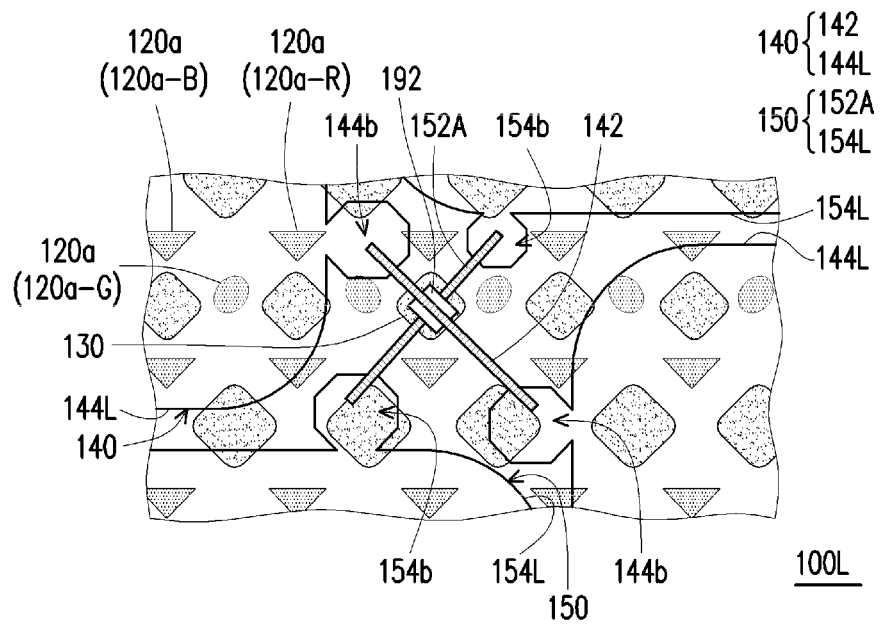
FIG. 17 is a schematic top view illustrating a touch display panel according to an embodiment of the disclosure.

FIG. 17 is a schematic top view illustrating a touch display panel according to an embodiment of the disclosure. A touch display panel 100L of FIG. 17 is similar to the touch display panel 100A. Therefore, like or corresponding components are referred to with like or corresponding reference symbols. The touch display panel 100L mainly differs from the touch display panel 100A in that shapes of first sensing parts 144L and second sensing parts 154L of the touch display panel 100L differ from the shapes of the first sensing parts 144 and the second sensing parts 154 of the touch display panel 100A. The following descriptions mainly focus on the difference between the touch display panel 100L and the touch display panel 100A, and the same or corresponding parts are referred to the foregoing descriptions.

Referring to FIG. 17, the touch display panel 100L includes the first touch electrode 140 and the second touch electrode 150. The first touch electrode 140 has the first bridge part 142 and the first sensing parts 144L. The first bridge part 142 is electrically connected between two adjacent first sensing parts 144L. The second touch electrode 150 has the second bridge part 152A and the second sensing parts 154L. The second bridge part 152A is electrically connected between two adjacent second sensing parts 154L. The first bridge part 142 of the first touch electrode 140 is crossed with the second bridge part 152A of the second touch electrode 150. What differs from the touch display panel 100A is that, in the embodiment of FIG. 17, the first sensing parts 144L and the second sensing parts 154L may respectively have small locally protruding areas 144b and 154b. Two ends of the first bridge part 142 are respectively electrically connected with the small areas 144b of two adjacent first sensing parts 144L. Two ends of the second bridge part 152A are respectively electrically connected with the small areas 154b of two adjacent second sensing parts 154L. Accordingly, lengths of the first bridge part 142 and the second bridge part 152A are able to be reduced, so as to reduce the resistances of the first touch electrode 140 and the second touch electrode 150. In this embodiment, the first bridge part 142 may shield light, whereas the first sensing part 144L and the second sensing part 154L may be transparent. However, the disclosure is not limited thereto.

In view of the foregoing, the first bridge part adopted in the touch display panel according to an embodiment of the disclosure is electrically connected with two adjacent first sensing parts. The first sensing parts and the first bridge part are serially connected to form the first touch electrode. The first bridge part has a low resistance rate. Therefore, the first touch electrode has a low resistance, so the touch performance of the touch display panel is able to be facilitated. More importantly, the first bridge part is disposed on the spacer (or protrusion) outside the light emitting area. Therefore, the first bridge part does not overly affect the brightness of the touch display panel, and the touch display panel may exhibit preferable touch and display properties.

It will be apparent to those skilled in the art that various modifications and variations can be made to the structure of the disclosure without departing from the scope or spirit of the disclosure. In view of the foregoing, it is intended that the disclosure covers modifications and variations of this disclosure provided they fall within the scope of the following claims and their equivalents.

What is claimed is:
1. A touch display panel, comprising:
a first substrate;
an organic light emitting diode device layer, disposed on the first substrate and having a light emitting area;
a spacer, disposed on the organic light emitting diode device layer and located outside the light emitting area; and
a first touch electrode and a second touch electrode, disposed on the organic light emitting diode device layer, wherein the first touch electrode has a first bridge part, the first bridge part of the first touch electrode is crossed with and electrically insulated from the second touch electrode, and at least a portion of the first bridge part is disposed on the spacer and is raised by the spacer to be farther from the first substrate than the rest portion of the first bridge part,
wherein the second touch electrode comprises a plurality of second sensing parts and a second bridge part, the second bridge part is electrically connected between two adjacent second sensing parts, the first bridge part is crossed with and electrically insulated from the second bridge part, at least one of the first bridge part and the second bridge part is a zigzag line pattern, and the zigzag line pattern is away from the light emitting area by a distance.

2. The touch display panel as claimed in claim 1, wherein the first touch electrode further comprises a plurality of first sensing parts, and the first bridge part is electrically connected between two adjacent first sensing parts.

3. The touch display panel as claimed in claim 2, further comprising:
   an insulating pattern, wherein the first sensing parts, the second sensing parts, and the second bridge part are disposed on the organic light emitting diode device layer, the insulating pattern covers the second bridge part, and the first bridge part crosses the insulating pattern to electrically connect the two adjacent first sensing parts.

4. The touch display panel as claimed in claim 2, further comprising:
   an insulating pattern, wherein the first bridge part is disposed on the organic light emitting diode device layer, the insulating pattern covers a portion of the first bridge part, the two adjacent first sensing parts cover two ends of the first bridge part, and the second bridge part of the second touch electrode is located on the insulating pattern.

5. The touch display panel as claimed in claim 2, further comprising:
   an insulating pattern, wherein the first sensing parts and the second sensing parts are disposed on the organic light emitting diode device layer, the second bridge part is located on the spacer, the insulating pattern covers the second bridge part, and the first bridge part crosses the insulating pattern to electrically connect the two adjacent first sensing parts.

6. The touch display panel as claimed in claim 2, further comprising:
   an insulating pattern, wherein the first bridge part is disposed on the organic light emitting diode device layer, the insulating pattern covers a portion of the first bridge part, the two adjacent first sensing parts cover two ends of the first bridge part, the second sensing parts are disposed on the organic light emitting diode device layer, and the second bridge part crosses the insulating pattern to electrically connect the two adjacent second sensing parts.

7. The touch display panel as claimed in claim 1, wherein an end of the first bridge part is in an arc shape.

8. The touch display panel as claimed in claim 1, wherein the second touch electrode comprises the second bridge part crossed with and electrically insulated from the first bridge part, and an end of the second bridge part is in an arc shape.

9. The touch display panel as claimed in claim 1, wherein the first touch electrode further comprises a plurality of first sensing parts, the first bridge part is electrically connected between two adjacent first sensing parts, and an edge of a portion of one of the first sensing parts is in an arc shape.

10. The touch display panel as claimed in claim 1, further comprising:
    an encapsulation layer, covering the organic light emitting diode device layer, wherein the first touch electrode and the second touch electrode are disposed on the encapsulation layer.

11. The touch display panel as claimed in claim 10, wherein the organic light emitting diode device layer comprises:
    at least one active device, disposed on the first substrate;
    a first display electrode, electrically connected with the at least one active device;
    an insulating layer, covering the at least one active device and exposing an opening of the first display electrode; and
    an organic light emitting pattern, contacting the opening of the insulating layer, so as to electrically connect with the first display electrode.

12. The touch display panel as claimed in claim 11, further comprising:
    a second display electrode, covering the organic light emitting pattern and electrically connected with the organic light emitting pattern.

13. The touch display panel as claimed in claim 12, wherein the spacer is disposed on the insulating layer.

14. The touch display panel as claimed in claim 13, wherein the second display electrode covers the spacer, an electrode protruding part is formed on the spacer, the encapsulation layer covers the second display electrode, an encapsulation protruding part is formed on the electrode protruding part, and the first bridge part is disposed on a protruding structure formed by the spacer, the electrode protruding part and the encapsulation protruding part.

* * * * *